(12) United States Patent
Ding et al.

(10) Patent No.: US 11,778,760 B2
(45) Date of Patent: Oct. 3, 2023

(54) CHIP PACKAGING STRUCTURE AND DISPLAY DEVICE

(71) Applicants: Hefei BOE Optoelectronics Technology Co., Ltd., Hefei (CN); BOE Technology Group Co., Ltd., Beijing (CN)

(72) Inventors: Peng Ding, Beijing (CN); Zhixiang Fang, Beijing (CN); Guanglei Yang, Beijing (CN); Meng Wang, Beijing (CN); Xuxu Hu, Beijing (CN)

(73) Assignees: Hefei BOE Optoelectronics Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 17/417,837

(22) PCT Filed: Dec. 24, 2020

(86) PCT No.: PCT/CN2020/139093
§ 371 (c)(1),
(2) Date: Jun. 24, 2021

(87) PCT Pub. No.: WO2021/136069
PCT Pub. Date: Jul. 8, 2021

(65) Prior Publication Data
US 2023/0007793 A1    Jan. 5, 2023

(30) Foreign Application Priority Data

Jan. 3, 2020 (CN) .......................... 202010005854.4

(51) Int. Cl.
*H05K 5/00* (2006.01)
*H05K 1/11* (2006.01)
*H05K 1/14* (2006.01)

(52) U.S. Cl.
CPC ............ *H05K 5/0069* (2013.01); *H05K 1/111* (2013.01); *H05K 1/148* (2013.01); *H05K 5/0018* (2022.08); *H05K 2201/09418* (2013.01)

(58) Field of Classification Search
CPC .... H05K 5/0069; H05K 5/0018; H05K 1/111; H05K 1/148; H05K 2201/09418
(Continued)

(56) References Cited

U.S. PATENT DOCUMENTS

2009/0256471 A1    10/2009  Kim et al.
2015/0138474 A1    5/2015   Chang et al.
(Continued)

FOREIGN PATENT DOCUMENTS

CN    103558703 A    2/2014
CN    106255310 A    12/2016
(Continued)

OTHER PUBLICATIONS

CN202010005854.4 First Office Action.
CN202010005854.4 Second Office Action.
CN202010005854.4 Search Report.

*Primary Examiner* — Andargie M Aychillhum
(74) *Attorney, Agent, or Firm* — IPRO, PLLC (57) ABSTRACT

The present disclosure provides a chip packaging structure including at least one chip packaging unit. The chip packaging unit includes a flexible substrate and a rigid substrate. The flexible substrate includes a first flexible substrate body, and a plurality of input pads and a plurality of output pads arranged on the first flexible substrate body, wherein the input pads and the output pads are connected in one-to-one correspondence. The rigid substrate includes a rigid substrate body and a chip arranged on the rigid substrate body, wherein the rigid substrate is bonded to a drive printed circuit board of a display device. Two opposite sides of the
(Continued)

flexible substrate are respectively bonded to the rigid substrate and a display panel of the display device. The plurality of input pads are electrically connected to the chip, and the plurality of output pads are configured to transmit signals to the display panel.

22 Claims, 6 Drawing Sheets

(58) Field of Classification Search
USPC .......................................................... 361/752
See application file for complete search history.

(56) References Cited

U.S. PATENT DOCUMENTS

| | | | |
|---|---|---|---|
| 2019/0056812 A1 | 2/2019 | Wang et al. | |
| 2019/0305070 A1 | 10/2019 | Lee et al. | |
| 2019/0354210 A1* | 11/2019 | Akhbari | G06F 3/0436 |
| 2019/0371737 A1* | 12/2019 | Kim | H01L 23/562 |
| 2021/0296394 A1 | 9/2021 | Meng et al. | |
| 2021/0333845 A1 | 10/2021 | Zhou | |

FOREIGN PATENT DOCUMENTS

| | | |
|---|---|---|
| CN | 106647069 A | 5/2017 |
| CN | 106773204 A | 5/2017 |
| CN | 106896960 A | 6/2017 |
| CN | 107450777 A | 12/2017 |
| CN | 108803103 A | 11/2018 |
| CN | 108803164 A | 11/2018 |
| CN | 110111684 A | 8/2019 |
| CN | 110164874 A | 8/2019 |
| CN | 110164901 A | 8/2019 |
| CN | 110286535 A | 9/2019 |
| CN | 110323252 A | 10/2019 |
| CN | 111179755 A | 5/2020 |
| KR | 100932981 B1 | 12/2009 |

* cited by examiner

CHIP PACKAGING STRUCTURE AND DISPLAY DEVICE

CROSS REFERENCE OF RELEVANT APPLICATION

The present disclosure claims priority to Chinese Patent Application No. 202010005854.4, titled "CHIP PACKAGING STRUCTURE AND DISPLAY DEVICE" and filed to the State Patent Intellectual Property Office on Jan. 3, 2020, the entire contents of which are incorporated herein by reference.

TECHNICAL FIELD

The present disclosure generally relates to the field of display technologies, and more particularly, to a chip packaging structure and a display device.

BACKGROUND

In recent years, as borders of small-sized chip-on-film (COF) products have become narrower and narrower, consumers have increasing demands for narrow borders of large-sized flat-panel products such as tablet personal computers (TPC). The COF is a chip-on-film packaging technology for fixing drive integrated circuits on flexible circuit boards.

SUMMARY

Embodiments of the present disclosure provide a chip packaging structure and a display device.

The embodiments of the present disclosure provide a chip packaging structure applied to the display device, the chip packaging structure includes at least one chip packaging unit, wherein the chip packaging unit includes:

a flexible substrate, which includes a first flexible substrate body and a plurality of input pads and a plurality of output pads arranged on the first flexible substrate body, wherein the plurality of input pads and the plurality of output pads are connected in one-to-one correspondence; and a rigid substrate, which includes a rigid substrate body and a chip arranged on the rigid substrate body.

The rigid substrate is bonded to a drive printed circuit board of the display device. A side of the flexible substrate is bonded to the rigid substrate, and another side of the flexible substrate is bonded to a display panel of the display device. The plurality of input pads are electrically connected to the chip, and the plurality of output pads are configured to transmit signals to the display panel.

Alternatively, the plurality of input pads and the plurality of output pads are respectively arranged on two opposite sides of the first flexible substrate body.

Alternatively, the plurality of input pads and the plurality of output pads are mirror-symmetrical.

Alternatively, the plurality of input pads are all arranged in the same row, and the plurality of output pads are all arranged in the same row.

Alternatively, the flexible substrate also includes a plurality of first traces arranged on the first flexible substrate body, the plurality of first traces are arranged between the plurality of input pads and the plurality of output pads, and the plurality of input pads and the plurality of output pads are connected in one-to-one correspondence through the first traces.

Alternatively, the plurality of input pads are arranged in two rows, and the plurality of output pads are arranged in two rows.

Alternatively, the flexible substrate also includes a second flexible substrate body, a plurality of second traces arranged on the second flexible substrate body, and a plurality of third traces arranged on the first flexible substrate body.

Among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

Alternatively, the first flexible substrate body includes a plurality of via holes, and the input pads in the outer row and the output pads in the outer row are connected to the corresponding second traces through the via holes.

Alternatively, the chip packaging structure includes two of the chip packaging units, and the rigid substrate bodies of the two chip packaging units are arranged separately.

Alternatively, the chip packaging structure includes two of the chip packaging units, and the rigid substrate bodies of the two chip packaging units are connected together.

The display device includes a display panel, a drive printed circuit board, and a chip packaging structure.

The chip packaging structure includes at least one chip packaging unit, wherein the chip packaging unit includes:

a flexible substrate, which includes a first flexible substrate body and a plurality of input pads and a plurality of output pads arranged on the first flexible substrate body, wherein the plurality of input pads and the plurality of output pads are connected in one-to-one correspondence; and a rigid substrate, which includes a rigid substrate body and a chip arranged on the rigid substrate body.

The rigid substrate is bonded to the drive printed circuit board. A side of the flexible substrate is bonded to the rigid substrate, and another side of the flexible substrate is bonded to the display panel. The plurality of input pads are electrically connected to the chip, and the plurality of output pads are configured to transmit signals to the display panel.

Alternatively, the plurality of input pads and the plurality of output pads are respectively arranged on two opposite sides of the first flexible substrate body.

Alternatively, the plurality of input pads and the plurality of output pads are mirror-symmetrical.

Alternatively, the plurality of input pads are all arranged in the same row, and the plurality of output pads are all arranged in the same row.

Alternatively, the flexible substrate also includes a plurality of first traces arranged on the first flexible substrate body, the plurality of first traces are arranged between the plurality of input pads and the plurality of output pads, and the plurality of input pads and the plurality of output pads are connected in one-to-one correspondence through the first traces.

Alternatively, the plurality of input pads are arranged in two rows, and the plurality of output pads are arranged in two rows.

Alternatively, the flexible substrate also includes a second flexible substrate body, a plurality of second traces arranged on the second flexible substrate body, and a plurality of third traces arranged on the first flexible substrate body.

Among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

Alternatively, the first flexible substrate body includes a plurality of via holes, and the input pads in the outer row and the output pads in the outer row are connected to the corresponding second traces through the via holes.

Alternatively, the chip packaging structure includes two of the chip packaging units, and the rigid substrate bodies of the two chip packaging units are arranged separately.

Alternatively, the chip packaging structure includes two of the chip packaging units, and the rigid substrate bodies of the two chip packaging units are connected together.

The above description is merely an overview of the technical solutions of the present disclosure. In order to more apparently understand the technical means of the present disclosure to implement in accordance with the contents of specification, and to more readily understand above and other objectives, features and advantages of the present disclosure, specific embodiments of the present disclosure are provided hereinafter.

BRIEF DESCRIPTION OF THE DRAWINGS

The accompanying drawings required for describing the embodiments or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in the embodiments of the present disclosure will be described clearly and completely below, in conjunction with the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

In the embodiments of the present disclosure, the words "first", "second", etc. are used to distinguish between the same or similar items whose functions and roles are basically the same. In order to clearly describe the technical solutions of the embodiments of the present disclosure, the words "first", "second", etc. cannot be understood as indicating or implying relative importance or implying the number of indicated technical features. In the embodiments of the present disclosure, "a plurality of" refers to two or more, unless otherwise expressly specified. In addition, in the description of the present disclosure, it is to be understood that the orientations or positions represented by the terms of "up", "down", "inside", "outside", and the like are based on the accompanying drawings, they are merely for ease of a description of the present disclosure and a simplified description instead of being intended to indicate or imply the device or element to have a special orientation or to be configured and operated in a special orientation. Thus, they cannot be understood as limiting of the present disclosure.

Figure 1:
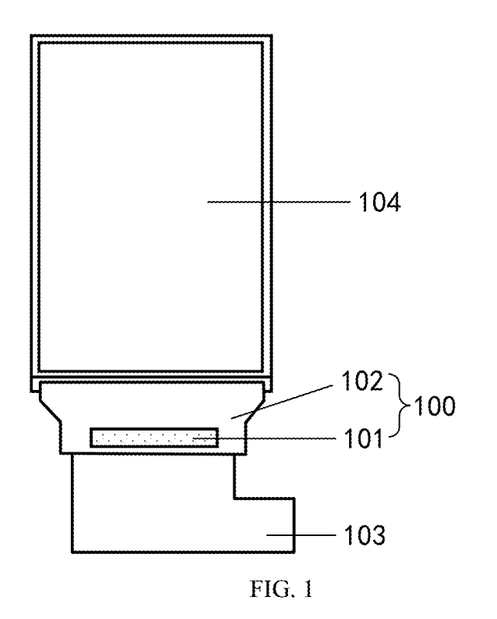
FIG. 1 is a schematic structural diagram of a display device provided in the related technologies.

In the related technologies, a schematic structural diagram of a conventional mobile phone chip-on-film product is as shown in FIG. 1. A chip-on-film substrate 100 includes a flexible substrate body 102 and an integrated circuit 101 arranged on the flexible substrate body 102. The chip-on-film substrate 100 is bonded to a low temperature polysilicon (LTPS) display panel 104 and a flexible printed circuit (FPC) 103 respectively.

Figure 2:
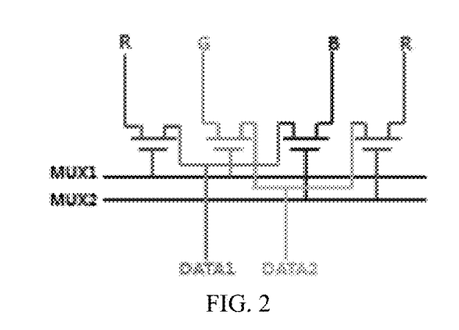
FIG. 2 is a schematic drive diagram of a multiplexer provided in the related technologies.

Limited by a fabrication process of a chip-on-film integrated circuit, a pitch between centers of adjacent pads in the chip on film shall not be made too small. At present, the smallest pitch made in the industry adopting the related technologies is 18 μm, and the chip-on-film integrated circuit mostly adopts an LTPS multiplexer (MUX) drive method to achieve full high definition (FHD) (resolution 1920×1080) display. In the LTPS MUX scheme, one source data line is employed to drive two or more sub-pixels in a time sharing manner. With reference to FIG. 2, under the control of MUX1 and MUX2, a first wiring DATA1 drives a sub-pixel R (red sub-pixel) and a sub-pixel B (blue sub-pixel) on the left side in the time sharing manner, a second wiring DATA2 drives a sub-pixel G (green sub-pixel) and a sub-pixel R on the right side in the time sharing manner, MUX1 and MUX2 control two sub-pixels respectively, and this structure belongs to MUX2:4. Of course, there are more modes such as MUX1:3, which are not described in detail here.

The embodiments of the present disclosure provide a chip packaging structure, which is applied to a display device. The display device includes a display panel and a drive printed circuit board, and the chip packaging structure includes at least one chip packaging unit.

Figure 3:
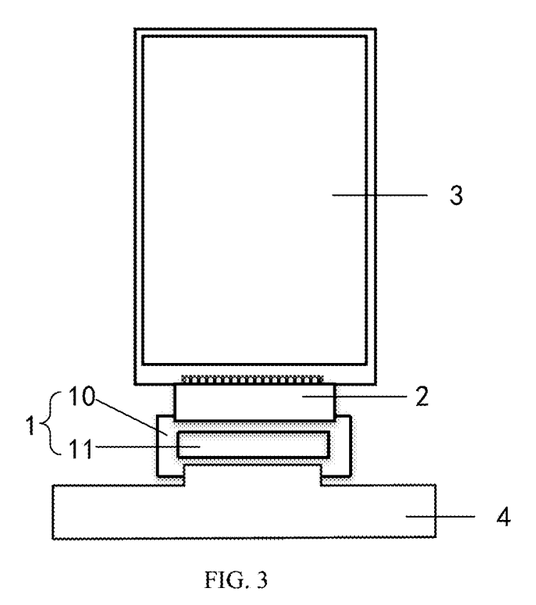
FIG. 3 is a schematic structural diagram of a first chip packaging structure according to an embodiment of the present disclosure.

Referring to FIG. 3, the chip packaging unit includes a flexible substrate 2 and a rigid substrate 1.

The flexible substrate 2 includes a first flexible substrate body (not shown in FIG. 3, please referring to FIG. 7) and a plurality of input pads (not shown in FIG. 3, please referring to FIG. 6) and a plurality of output pads (not shown in FIG. 3, please referring to FIG. 6) arranged on the first flexible substrate body, wherein the plurality of input pads and the plurality of output pads are connected in one-to-one correspondence.

The rigid substrate 1 includes a rigid substrate body 10 and a chip 11 arranged on the rigid substrate body 10.

The rigid substrate 1 is bonded to a drive printed circuit board 4. Two opposite sides of the flexible substrate 2 are respectively bonded to the rigid substrate 1 and a display panel 3. The plurality of input pads are electrically connected to the chip, and the plurality of output pads are configured to transmit signals to the display panel.

The number of the above-mentioned chip packaging units may be determined according to the resolution of the display panel, which is not specifically limited here. Types of the display device are not limited, which may be a liquid crystal display (LCD) device, or may be an organic light-emitting diode (OLED) display device.

The above-mentioned drive printed circuit board may be a printed circuit board (PCB) or a flexible printed circuit (FPC). In consideration of further reduction in border, the latter may be selected. It is to be noted that after components of the flexible printed circuit are soldered and assembled, a flexible printed circuit assembly (FPCA) may be formed. The drive printed circuit board 4 as shown in FIG. 3 may be an FPCA circuit board.

A material of the rigid substrate is not limited. In practical application, in consideration of the related technologies and still further reducing costs, a glass substrate may be selected.

Figure 4:
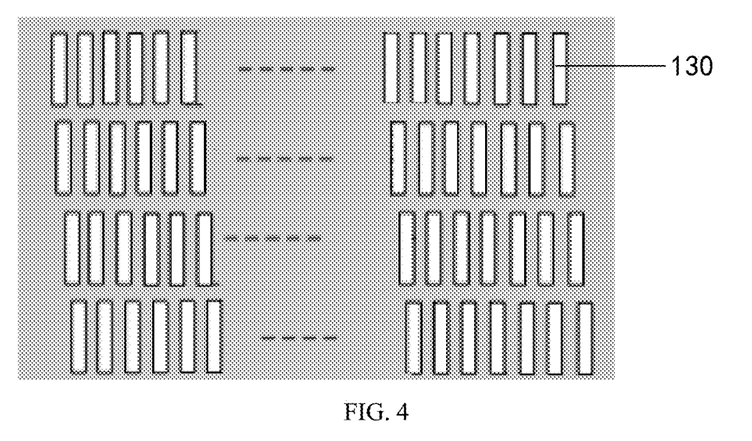
FIG. 4 is a distribution diagram of pads in an integrated circuit provided in the related technologies.
Figure 5:
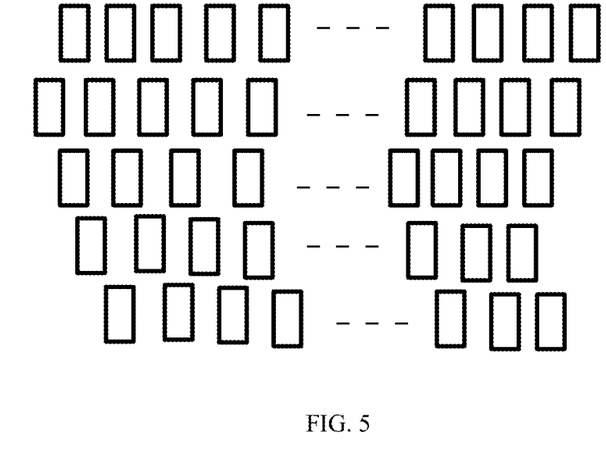
FIG. 5 is a distribution diagram of pads in an integrated circuit according to an embodiment of the present disclosure.

Arrangement modes of the output pads of the chip arranged on the rigid substrate body are not limited, and are determined according to actual situations. The output pads (130 as shown in FIG. 4) of a source channel of a conventional COG (Chip On Glass) integrated circuit are generally arranged in three rows or four rows as shown in FIG. 4. This chip packaging unit may be applied to a display device which is not very high in resolution requirements. However, if the above chip packaging unit is applied to a display device having a very high resolution, such as a WQ-level (resolution of 1600*2560) display device, the above arrangement mode of four-row output pads cannot meet actual requirements. Reference is made by taking an example where the above chip packaging unit is applied to the WQ-level display device, because the resolution is 1600*2560, a total of 1600*3=4800 source channels are required. That is, 4,800 output pads need to be provided for the integrated circuit. If the output pads are arranged in four rows, 1,200 pads need to be arranged in each row. Calculated based on a fact that a pad pitch (distance between centers of two adjacent pads) is 30 μm, a width occupied by one row of pads is 1200*30 μm=36,000 μm. However, a maximum width of an existing conventional single integrated circuit is about 33 mm. As can be seen, the pad pitch in the arrangement mode of four-row output pads has exceeded the maximum width of the existing single integrated circuit. In this case, the four-row arrangement mode needs to be changed to a five-row arrangement mode as shown in FIG. 5. If the output pads are arranged in five rows as shown in FIG. 5, 4800/5=960 output pads need to be arranged in each row. Calculated based on a fact that the pad pitch is 34 μm and a mark width on one side is 80 μm, a width occupied by one row of output pads is 960*34 μm+80 μm*2=32,800 μm=32.80 mm<33 mm. That is, the width occupied by one row of output pads does not exceed the maximum width of the existing single integrated circuit. In this case, the width of each output pad may be 12 μm, and a length of each output pad may be 100 μm.

The embodiments of the present disclosure provide a chip packaging structure, which is applied to a display device. The display device includes a display panel and a drive printed circuit board. The chip packaging structure includes at least one chip packaging unit. The chip packaging unit includes a flexible substrate and a rigid substrate. The flexible substrate includes a first flexible substrate body, and a plurality of input pads and a plurality of output pads arranged on the first flexible substrate body, wherein the input pads and the output pads are connected in one-to-one correspondence. The rigid substrate includes a rigid substrate body and a chip arranged on the rigid substrate body, wherein the rigid substrate is bonded to the drive printed circuit board. Two opposite sides of the flexible substrate are respectively bonded to the rigid substrate and the display panel. The plurality of input pads are electrically connected to the chip, and the plurality of output pads are configured to transmit signals to the display panel.

In this chip packaging structure, a chip is arranged on the rigid substrate body, and the rigid substrate provided with the chip is connected to the display panel through the flexible substrate. In this way, in one aspect, this chip packaging structure may be bent at the flexible substrate to reduce a border, such that a narrow border may be achieved. In another aspect, compared with a scheme where the chip is arranged on the flexible substrate body, the scheme where the chip is arranged on the rigid substrate body is greatly reduced in both difficulty and costs. That is, the above-mentioned chip packaging structure can greatly reduce the costs while meeting the requirement for the narrow border.

Figure 6:
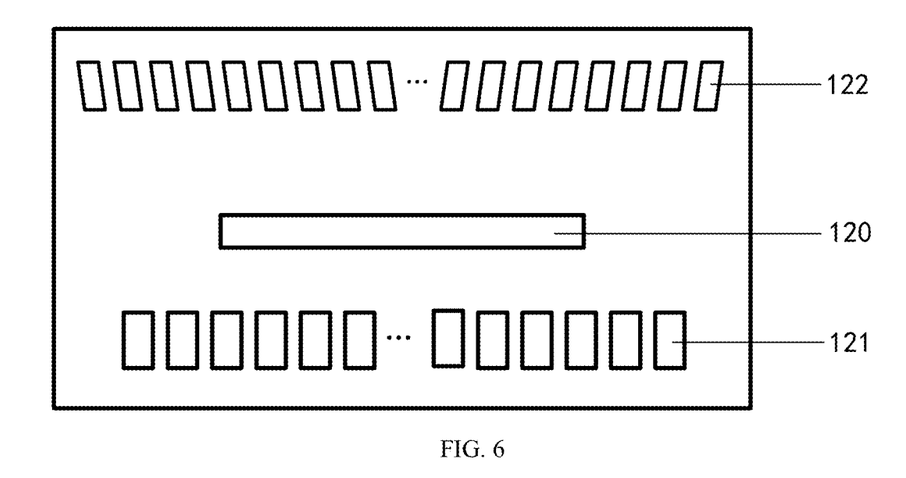
FIG. 6 is a schematic structural diagram of a chip on film provided in the related technologies.

In the related technologies, the schematic structural diagram of the chip on film (COF) may also be as shown in FIG. 6. The chip on film includes a plurality of input pads 121, a plurality of output pads 122, and an integrated circuit 120 between the plurality of input pads 121 and the plurality of output pads 122. The plurality of input pads 121 and the plurality of output pads 122 are electrically connected to the integrated circuit 120, respectively. In this structure, different signal trace lengths may cause different impedances; and different pad pitches between the input pads and the output pads may cause different expansion coefficients of the input and output pads, which makes the design of the COF traces more complicated.

However, in the chip packaging structure provided by the embodiments of the present disclosure, the plurality of input pads and the plurality of output pads included in the flexible substrate are respectively arranged on two opposite sides of the first flexible substrate body and are mirror-symmetrical, which can simplify the design of the traces.

Concrete structures of two types of flexible substrates are provided below.

Figure 7:
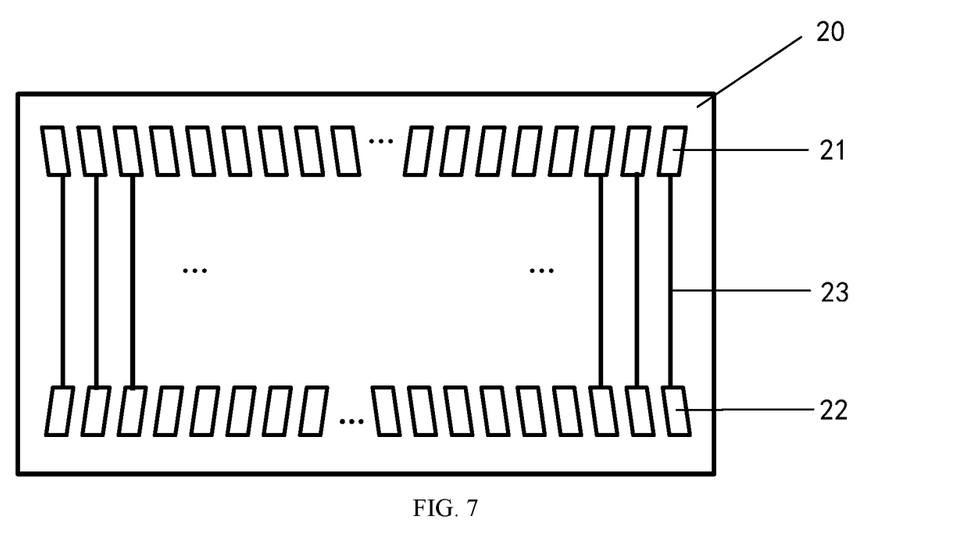
FIG. 7 is a schematic structural diagram of a flexible substrate according to an embodiment of the present disclosure.

FIG. 7 shows the structure of the first type of flexible substrate. A plurality of input pads 22 and a plurality of output pads 21 included in this flexible substrate are respectively arranged on two opposite sides of a first flexible substrate body 20 and are mirror-symmetrical, the plurality of input pads 22 are all arranged in the same row, and the plurality of output pads 21 are all arranged in the same row. The flexible substrate also includes a plurality of first traces 23 arranged on the first flexible substrate body 20, the plurality of first traces 23 are arranged between the plurality of input pads 22 and the plurality of output pads 21, and the plurality of input pads 22 and the plurality of output pads 21 are connected in one-to-one correspondence through the first traces 23.

Including a layer of flexible substrate body, this structure has a single-layer chip-on-film single-row pad structure, and is lower in costs and simpler in design. The input pads and the output pads are mirror-symmetrical and have equal pad pitch, and are directly connected through the first traces. In this way, it is ensured that different signal lines have basically the same impedance, and the input pads and the output pads are all bonded to glass, and have an equal expansion coefficient.

Figure 8:
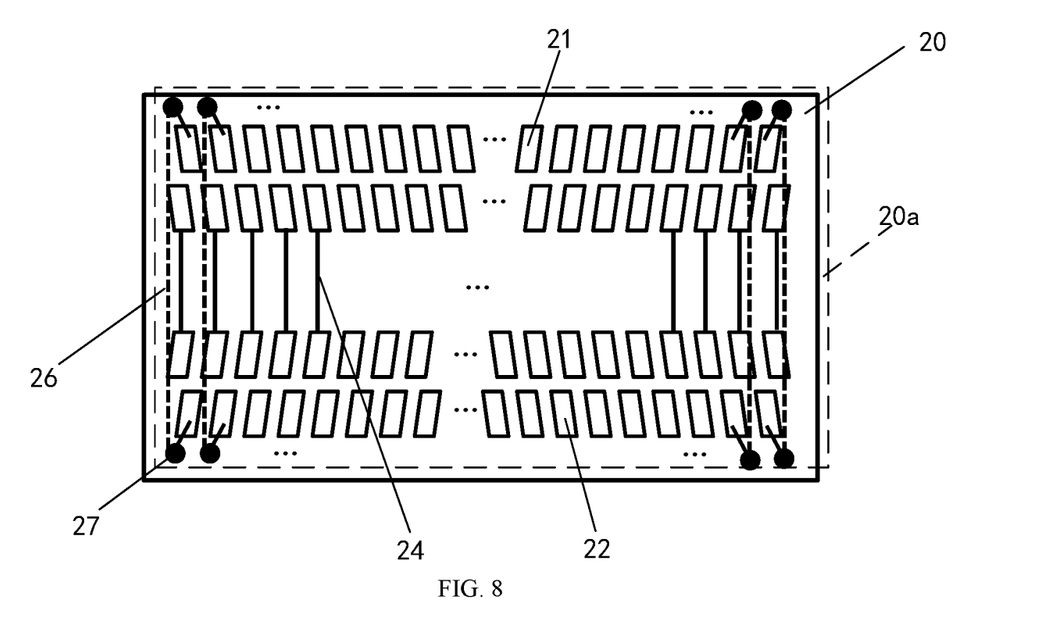
FIG. 8 is a schematic structural diagram of another flexible substrate according to an embodiment of the present disclosure.

FIG. 8 shows the structure of the second type of flexible substrate. A plurality of input pads 22 and a plurality of output pads 21 included in this flexible substrate are respectively arranged on two opposite sides of the first flexible substrate body 20 and are mirror-symmetrical, the plurality of input pads 22 are arranged in two rows, and the plurality of output pads 21 are arranged in two rows. The flexible substrate also includes a second flexible substrate body 20a, a plurality of second traces 26 arranged on the second flexible substrate body 20a, and a plurality of third traces 24 arranged on the first flexible substrate body 20. The input pads 22 in an inner row and the output pads 21 in an inner row are connected in one-to-one correspondence through the third traces 24, and the input pads 22 in an outer row and the output pads 21 in an outer row are connected in one-to-one correspondence through the second traces 26.

Here, the input pads 22 in the inner row may refer to one of the two rows of input pads 22 closer to the output pads 21, or the row of input pads 22 facing toward the output pads 21. Similarly, the input pads 22 in the outer row here may refer to one of the two rows of input pads 22 farther away from the output pads 21.

Here, the output pads 21 in the inner row may refer to one of the two rows of output pads 21 closer to the input pads 22, or the row of output pads 21 facing toward the input pads 22. Similarly, the output pads 21 in the outer row here may refer to one of the two rows of output pads 21 farther away from the input pads 22.

FIG. 8 shows the aforementioned second flexible substrate body 20a in the form of a dashed-line box. Those skilled in the art may understand that the second flexible substrate body 20a may be corresponding to the first flexible substrate body 20 in position. In FIG. 8, the second flexible substrate body 20a indicated by the dashed-line box is drawn in a staggered manner to clearly show the second flexible substrate body 20a. A plurality of second traces 26 are arranged on the second flexible substrate body 20a. In addition, the second flexible substrate body 20a may be arranged above the first flexible substrate body 20, or may be arranged below the first flexible substrate body 20, which is not limited here. In FIG. 8, it is drawn by taking an example where the first flexible substrate body 20 is arranged above the second flexible substrate body 20a, wherein the second traces 26 are indicated by dashed lines because the second traces 26 are located below the first flexible substrate body 20, and it does not represent that the second traces 26 are disconnected. In this case, the second flexible substrate body 20a serves as a bottom layer (BOT layer), and the first flexible substrate body 20 serves as a top layer (Top layer).

The above-mentioned structure includes two layers of flexible substrate bodies, and is a double-layer chip-on-film double-row pad structure. The input pads and the output pads are mirror-symmetrical and have an equal pad pitch. The input pads in the inner row and the output pads in the inner row are connected in one-to-one correspondence through the third traces, and the input pads in the outer row and the output pads in the outer row are connected in one-to-one correspondence through the second traces. In this way, it is ensured that different signal lines have basically the same impedance, and the input pads and the output pads are all bonded to glass, and have an equal expansion coefficient. Compared with a design scheme of traces in a single-layer chip-on-film integrated circuit in the related technologies, this scheme is simple and easy for implementation.

Alternatively, with reference to FIG. 8, the first flexible substrate body 20 is provided with a plurality of via holes 27, and the input pads 22 in the outer row and the output pads 21 in the outer row are connected to the corresponding second traces 26 through the via holes 27. This connection mode is simple and easy for implementation.

At present, generally there are three specifications for the width of a chip on film in the industry: 35 mm, 48 mm, and 70 mm. An effective width of the 70 mm chip on film is 63.5 mm, and a single-layer chip on film is mostly used. Arrangement of the input and output pads is the single-row arrangement as shown in FIG. 6, which may be applied to a display device not very high in resolution requirements. However, if the display device has a very high resolution, for example, if the display device is a WQ-level (resolution of 1600*2560) display device, the above single-row arrangement of the input and output pads cannot meet actual requirements. Taking a WQ-level panel and a 70 mm chip on film as an example, the number of source channels required for the WQ panel is 1600*3=4,800, plus about 100 Gout pins for connecting the display panel. That is, a total of about 4,900 source channels are required. If a single-layer chip-on-film single-row pad structure is adopted, even if the smallest chip-on-film pitch available in the industry is 18 μm, the width occupied by each row of pads is 18 μm*4900=88.2 mm, which is far more than the effective width 63.5 mm. In this case, it is necessary to adopt a double-layer chip-on-film double-row pad structure. In the double-layer chip-on-film double-row pad structure, the number of pads in each row is 4900/2=2450. Calculated according to a bonding pitch of 25 μm in the industry, the width occupied by each row of pads is 25 μm*2450=61.25 mm, plus the width (approximately 1.8 mm) of an alignment mark, the total width is 61.25 mm+1.8 mm=63.05 mm<63.5 mm, which does not exceed the effective width of the chip on film.

Figure 12:
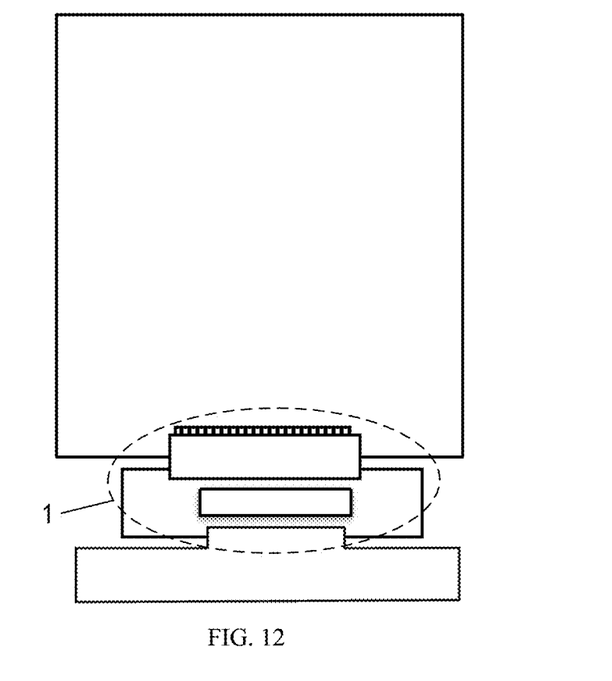
FIG. 12 is a schematic structural diagram of a fourth chip packaging structure according to an embodiment of the present disclosure.

That is, the first type of flexible substrate shown in FIG. 7 provided by the embodiments of the present disclosure is more suitable for display devices with lower resolution. If this flexible substrate is to be applied to display devices with very high resolution (for example, WQ-level display devices), a plurality of chip packaging structures need to be cascaded together to meet the requirements. For example, if this flexible substrate is applied to a tablet computer display device of about 10.5-11.6 inches, two chip packaging units need to be provided, wherein each chip packaging unit includes the structure of the first type of flexible substrate described above. The second type of flexible substrate shown in FIG. 8 provided by the embodiments of the present disclosure may be applied to display devices with a very high resolution (for example, WQ-level display devices). In this case, the chip packaging unit may be as shown in FIG. 12. That is, two chip packaging units are incorporated into one large chip packaging unit.

In related technologies, in a regular-sized mobile phone, one chip-on-film integrated circuit is employed to drive sub-pixels to display through an LTPS multiplexer scheme. However, as the size of the display panel continues to increase and the resolution thereof continues to improve, for example, if a WQ-level (resolution 2560*1600) tablet personal computer (TPC) product adopts this LTPS multiplexer scheme, a risk of insufficient charging may be caused.

Figure 9:
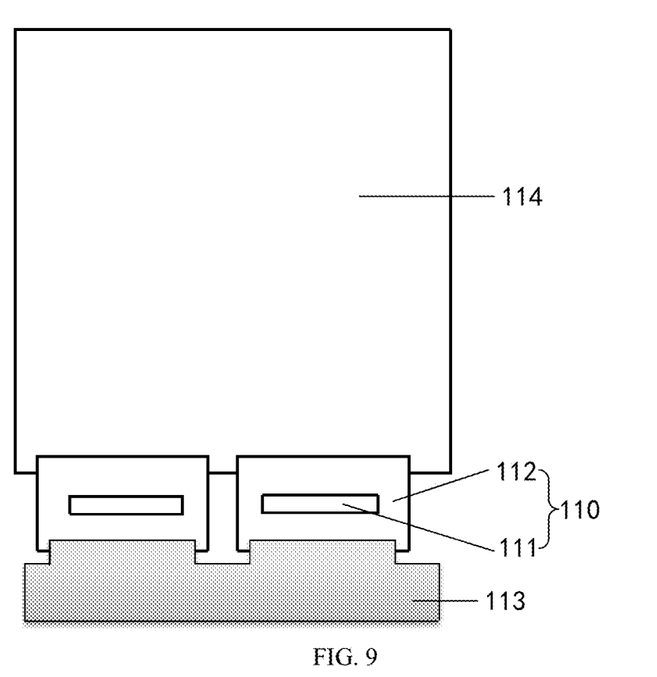
FIG. 9 is a schematic structural diagram of another display device provided in the related technologies.

Furthermore, the chip-on-film integrated circuit is limited by the process limit of a trace width and pitch of the chip on film, the number of channels of one chip-on-film integrated circuit cannot meet the resolution requirements. As shown in FIG. 9, it is necessary to use two cascaded chip-on-film integrated circuits 111 to support WQ-level display. Costs will be undoubtedly further increased if the original chip-on-film structure is still adopted, which is greatly disadvantageous to low-cost market demands and sustainable development of subsequent products. In FIG. 9, the chip-on-film structure 110 also includes a flexible substrate body 112. One side of the chip-on-film structure 110 is bonded to a flexible printed circuit 113, and the other side of the chip-on-film structure 110 is bonded to a large-sized display panel 114, for example, a tablet computer display panel about 10.5-11.6 inches.

For a high-resolution (for example, WQ-level) display device, the embodiments of the present disclosure provide the following three structures.

Figure 10:
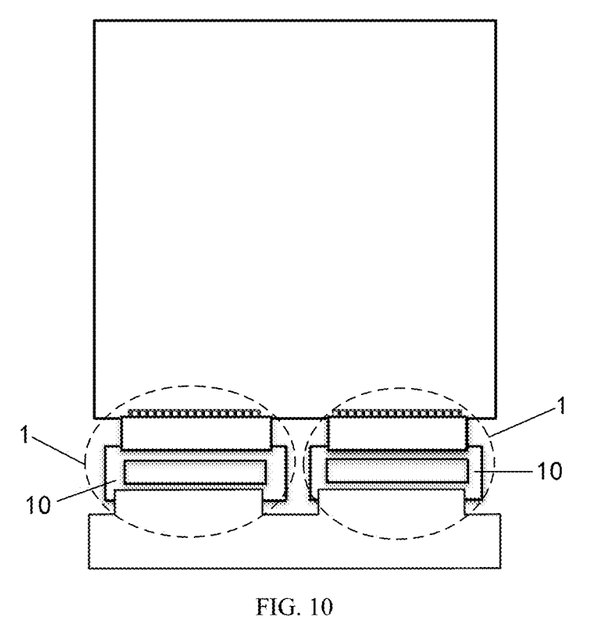
FIG. 10 is a schematic structural diagram of a second chip packaging structure according to an embodiment of the present disclosure.

In the first structure, referring to FIG. 10, the chip packaging structure includes two chip packaging units 1, wherein the rigid substrate bodies 10 of the two chip packaging units 1 are separately arranged. In this chip packaging structure, the structure of the flexible substrate of each chip packaging unit may be as shown in FIG. 7, and the pads of the chip on the rigid substrate may be arranged in three rows or four rows.

Figure 11:
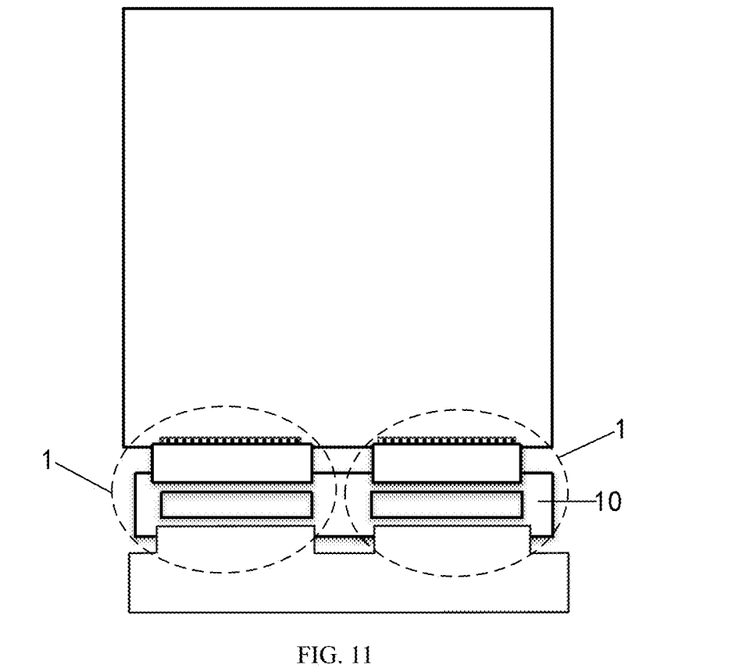
FIG. 11 is a schematic structural diagram of a third chip packaging structure according to an embodiment of the present disclosure.

In the second structure, referring to FIG. 11, the chip packaging structure includes two chip packaging units 1, wherein the two chip packaging units 1 share the same rigid substrate body 10. That is, two chips are bonded to the same rigid substrate body, such that synchronization signal lines of the two chips may be directly connected on the rigid substrate body instead of being connected on the drive printed circuit board. In this way, the number of bonding pads (also known as bonding pins) of the drive printed circuit board is reduced, which can shorten the overall width of the drive printed circuit board and save space for the whole structure. For example, if the chip adopts an arrangement mode of four-row pads, the number of the synchronization signal lines of the two chips is about 16. In this case, the number of bonding pads of the drive printed circuit board can be reduced by 16*4=64, thereby reducing the width of the drive printed circuit board in the horizontal direction (X direction).

The structure of the flexible substrate of each chip packaging unit may be as shown in FIG. 7, and the pads of the chip on the rigid substrate may be arranged in three rows or four rows.

In the third structure, the chip packaging structure includes one chip packaging unit 1, wherein this chip packaging unit 1 incorporates two chip packaging units, and thus is much larger than the chip packaging unit as shown in FIG. 10 and FIG. 11. This structure can reduce the number of bondings and simplify the technological process.

The structure of the flexible substrate of this chip packaging unit may be as shown in FIG. 8, and the pads of the chip on the rigid substrate may be arranged in five rows.

The above three structures may be applied to tablet computer display devices about 10.5-11.6 inches. Of course, if the three structures are applied to larger display devices, such as televisions and notebooks (NB), more chip packaging units may be cascaded, and arrangement modes thereof may be referred to the above three structures, and thus their detailed descriptions are omitted herein. In the above three structures, the display panel bonded to the flexible substrate may be any one of a polysilicon (poly-Si) display panel, an oxide display panel, and a low temperature poly-silicon (LTPS) display panel. Considering that the LTPS display panel has a lower yield and higher costs, to further reduce the costs, the polysilicon (poly-Si) display panel mature in technology may be selected. When applied to an LTPS display device, the above chip packaging structure can also improve the problem of insufficient charging of the conventional LTPS multiplexer. When applied to an oxide display device, the above chip packaging structure can also meet the requirements for high and low frequencies (30-120 Hz).

To utilize the existing process to a greater extent and to still further reduce the costs, the material of the rigid substrate body may be glass, and the arrangement mode of the chip is Chip On Glass (COG).

An embodiment of the present disclosure provides a display device, which includes any one of the chip packaging structure according to the forgoing embodiments.

The display device may be a rigid display device or a flexible display device (that is, bendable or foldable). The display device may be, for example, a twisted nematic (TN) liquid crystal display device, a vertical alignment (VA) liquid crystal display device, an in-plane switching (IPS) or advanced super dimension switch (ADS) liquid crystal display device, or an organic light-emitting diode (OLED) display device, and any products or components with display functions such as televisions, digital cameras, mobile phones, and tablet personal computers including these display devices. The display device has narrow borders and low costs.

"One embodiment", "embodiments" or "one or more embodiments" herein means that particular features, structures or characteristics described in combination with the embodiments are included in at least one embodiment of the present disclosure. Furthermore, it is to be noted that the term "in one embodiment" herein does not necessarily refers to the same embodiment.

Many details are discussed in the specification provided herein. However, it should be understood that the embodiments of the present disclosure can be practiced without these specific details. In some examples, the well-known methods, structures and technologies are not shown in detail so as to avoid an unclear understanding of the description.

In the claims, no reference mark between round brackets shall impose restriction on the claims. The word "comprise" does not exclude a component or step not listed in the claims. The wording "a" or "an" in front of an element does not exclude the presence of a plurality of such elements. The present disclosure may be realized by way of hardware comprising a number of different components and by way of a suitably programmed computer. In the unit claim listing a plurality of devices, some of these devices may be embodied in the same hardware.

The above is merely specific embodiments of the present disclosure, but the protection scope of the present disclosure is not limited thereto. Any variation or substitution easily conceivable to those skilled in the art shall fall into the protection scope of the present disclosure. Therefore, the protection scope of the present disclosure shall be subject to the protection scope of the claims.

Finally, it should be noted that the above embodiments are used only to describe and not limit the technical solution disclosed herein; Notwithstanding the detailed description of this disclosure by reference to the foregoing embodiments, ordinary people in the related art should understand that they may modify the technical solutions recorded in each of the foregoing embodiments or substitute equivalently some of the technical features therein. Such modifications or substitutions shall not detract the essence of the corresponding technical solutions from the spirit and scope of the technical solutions of the embodiments disclosed herein.

What is claimed is:

1. A chip packaging structure, comprising at least one chip packaging unit, the chip packaging unit comprising:
 a flexible substrate, the flexible substrate comprising a first flexible substrate body, a plurality of first traces arranged on the first flexible substrate body, and a plurality of input pads and a plurality of output pads arranged on the first flexible substrate body, the plurality of input pads and the plurality of output pads being connected in one-to-one correspondence through the first traces; and
 a rigid substrate, the rigid substrate comprising a rigid substrate body and a chip arranged on the rigid substrate body;
 wherein the rigid substrate is bonded to a drive printed circuit board of a display device;
 a side of the flexible substrate is bonded to the rigid substrate, and another side of the flexible substrate is bonded to a display panel of the display device; and the plurality of input pads are electrically connected to the chip, and the plurality of output pads are configured to transmit signals to the display panel.

2. The chip packaging structure according to claim 1, wherein the plurality of input pads and the plurality of output pads are respectively arranged on two opposite sides of the first flexible substrate body.

3. The chip packaging structure according to claim 2, wherein the plurality of input pads and the plurality of output pads are mirror-symmetrical.

4. The chip packaging structure according to claim 2, wherein the plurality of input pads are all arranged in a same row, and the plurality of output pads are all arranged in a same row.

5. The chip packaging structure according to claim 4, wherein the flexible substrate further comprises a plurality of first traces arranged on the first flexible substrate body, the plurality of first traces are arranged between the plurality of input pads and the plurality of output pads, and the plurality of input pads and the plurality of output pads are connected in one-to-one correspondence through the first traces.

6. The chip packaging structure according to claim 2, wherein the plurality of input pads are arranged in two rows, and the plurality of output pads are arranged in two rows.

7. The chip packaging structure according to claim 1, wherein the chip packaging structure comprises two of the chip packaging units, and the rigid substrate bodies of the two chip packaging units are arranged separately.

8. The chip packaging structure according to claim 1, wherein the chip packaging structure comprises two of the chip packaging units, and the rigid substrate bodies of the two chip packaging units are connected together.

9. A chip packaging structure, comprising at least one chip packaging unit, the chip packaging unit comprising:
 a flexible substrate, the flexible substrate comprising a first flexible substrate body and a plurality of input pads and a plurality of output pads arranged on the first flexible substrate body, the plurality of input pads and the plurality of output pads being connected in one-to-one correspondence; and
 a rigid substrate, the rigid substrate comprising a rigid substrate body and a chip arranged on the rigid substrate body;
 wherein the rigid substrate is bonded to a drive printed circuit board of a display device; a side of the flexible substrate is bonded to the rigid substrate, and another side of the flexible substrate is bonded to a display panel of the display device; and the plurality of input pads are electrically connected to the chip, and the plurality of output pads are configured to transmit signals to the display panel;
 The chip packaging structure according to claim 6, wherein the flexible substrate further comprises a second flexible substrate body, a plurality of second traces arranged on the second flexible substrate body, and a plurality of third traces arranged on the first flexible substrate body; and
 among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

10. The chip packaging structure according to claim 9, wherein the first flexible substrate body comprises a plurality of via holes, and the input pads in the outer row and the output pads in the outer row are connected to the corresponding second traces through the via holes.

11. The chip packaging structure according to claim 9, wherein the plurality of input pads are arranged in two rows, and the plurality of output pads are arranged in two rows; wherein among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

12. A display device, comprising a display panel, a drive printed circuit board, and a chip packaging structure;
 the chip packaging structure comprising at least one chip packaging unit, wherein the chip packaging unit comprises:
 a flexible substrate, the flexible substrate comprising a first flexible substrate body, a plurality of first traces arranged on the first flexible substrate body, and a plurality of input pads and a plurality of output pads arranged on the first flexible substrate body, the plurality of input pads and the plurality of output pads being connected in one-to-one correspondence through the first traces; and
 a rigid substrate, the rigid substrate comprising a rigid substrate body and a chip arranged on the rigid substrate body;
 wherein the rigid substrate is bonded to the drive printed circuit board; a side of the flexible substrate is bonded to the rigid substrate, and another side of the flexible substrate is bonded to the display panel; and the plurality of input pads are electrically connected to the chip, and the plurality of output pads are configured to transmit signals to the display panel.

13. The display device according to claim 12, wherein the plurality of input pads and the plurality of output pads are respectively arranged on two opposite sides of the first flexible substrate body.

14. The display device according to claim 13, wherein the plurality of input pads and the plurality of output pads are mirror-symmetrical.

15. The display device according to claim 13, wherein the plurality of input pads are all arranged in a same row, and the plurality of output pads are all arranged in a same row.

16. The display device according to claim 15, wherein the flexible substrate further comprises a plurality of first traces arranged on the first flexible substrate body, the plurality of first traces are arranged between the plurality of input pads and the plurality of output pads, and the plurality of input pads and the plurality of output pads are connected in one-to-one correspondence through the first traces.

17. The display device according to claim 13, wherein the plurality of input pads are arranged in two rows, and the plurality of output pads are arranged in two rows.

18. The display device according to claim 12, wherein the chip packaging structure comprises two of the chip packaging units, and the rigid substrate bodies of the two chip packaging units are arranged separately.

19. The display device according to claim 12, wherein the chip packaging structure comprises two of the chip packaging units, and the rigid substrate bodies of the two chip packaging units are connected together.

20. A display device, comprising a display panel, a drive printed circuit board, and a chip packaging structure;
the chip packaging structure comprising at least one chip packaging unit, wherein the chip packaging unit comprises:
a flexible substrate, the flexible substrate comprising a first flexible substrate body and a plurality of input pads and a plurality of output pads arranged on the first flexible substrate body, the plurality of input pads and the plurality of output pads being connected in one-to-one correspondence; and
a rigid substrate, the rigid substrate comprising a rigid substrate body and a chip arranged on the rigid substrate body;
wherein the rigid substrate is bonded to the drive printed circuit board; a side of the flexible substrate is bonded to the rigid substrate, and another side of the flexible substrate is bonded to the display panel; and the plurality of input pads are electrically connected to the chip, and the plurality of output pads are configured to transmit signals to the display panel; The display device according to claim 17,
wherein the flexible substrate further comprises a second flexible substrate body, a plurality of second traces arranged on the second flexible substrate body, and a plurality of third traces arranged on the first flexible substrate body; and
among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

21. The display device according to claim 20, wherein the first flexible substrate body comprises a plurality of via holes, and the input pads in the outer row and the output pads in the outer row are connected to the corresponding second traces through the via holes.

22. The display device according to claim 20, wherein the plurality of input pads are arranged in two rows, and the plurality of output pads are arranged in two rows; wherein among the two rows of input pads and the two rows of output pads, the input pads in an inner row and the output pads in an inner row are connected in one-to-one correspondence through the third traces, and the input pads in an outer row and the output pads in an outer row are connected in one-to-one correspondence through the second traces.

* * * * *